(12) United States Patent
Kotani et al.

(10) Patent No.: US 8,902,147 B2
(45) Date of Patent: *Dec. 2, 2014

(54) GATE SIGNAL LINE DRIVING CIRCUIT AND DISPLAY DEVICE

(71) Applicants: Japan Display Inc., Tokyo (JP); Panasonic Liquid Crystal Display Co., Ltd., Hyogo-ken (JP)

(72) Inventors: Yoshihiro Kotani, Chiba (JP); Mitsuru Goto, Chiba (JP)

(73) Assignees: Panasonic Liquid Crystal Display Co., Ltd., Hyogo-ken (JP); Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/143,655

(22) Filed: Dec. 30, 2013

(65) Prior Publication Data

US 2014/0111412 A1    Apr. 24, 2014

Related U.S. Application Data

(63) Continuation of application No. 12/761,423, filed on Apr. 16, 2010, now Pat. No. 8,638,284.

(30) Foreign Application Priority Data

Apr. 21, 2009 (JP) .................................. 2009-103257

(51) Int. Cl.
*G09G 3/36* (2006.01)
*G11C 19/18* (2006.01)
*G11C 19/28* (2006.01)

(52) U.S. Cl.
CPC ............ *G09G 3/3677* (2013.01); *G11C 19/184* (2013.01); *G11C 19/28* (2013.01)
USPC ........................................................ 345/100

(58) Field of Classification Search
USPC .................................................... 345/98, 100
See application file for complete search history.

(56) References Cited

U.S. PATENT DOCUMENTS

| | | | |
|---|---|---|---|
| 7,633,477 | B2 | 12/2009 | Jang et al. |
| 2004/0140839 | A1 | 7/2004 | Nagao et al. |
| 2005/0220263 | A1 | 10/2005 | Moon |
| 2006/0279511 | A1 | 12/2006 | Uh et al. |
| 2007/0070020 | A1 | 3/2007 | Edo et al. |
| 2007/0086558 | A1 | 4/2007 | Wei et al. |
| 2010/0265243 | A1 | 10/2010 | Kotani et al. |
| 2010/0302217 | A1 | 12/2010 | Ochiai et al. |
| 2011/0157112 | A1 | 6/2011 | Shibata et al. |

FOREIGN PATENT DOCUMENTS

| | | |
|---|---|---|
| JP | 2005-293817 | 10/2005 |
| JP | 2006-351171 | 12/2006 |
| JP | 2007-095190 | 4/2007 |
| JP | 2007-114781 | 5/2007 |

*Primary Examiner* — Chanh Nguyen
*Assistant Examiner* — Roy Rabindranath
(74) *Attorney, Agent, or Firm* — Antonelli, Terry, Stout & Kraus, LLP.

(57) ABSTRACT

A gate signal line driving circuit and a display device which can suppress the degradation of an element attributed to the use of the element for a long time, and can realize the prolongation of lifetime of the element are provided. With respect to elements to which a HIGH voltage is applied for a long time, a plurality of elements are connected in parallel, and at least some of the plurality of elements are driven by switching elements.

8 Claims, 11 Drawing Sheets

GATE SIGNAL LINE DRIVING CIRCUIT AND DISPLAY DEVICE

CROSS-REFERENCE TO RELATED APPLICATION

This application is a continuation of U.S. application Ser. No. 12/761,423, filed Apr. 16, 2010; and which present application claims priority from Japanese patent application JP 2009-103257 filed on Apr. 21, 2009, the contents of which are hereby incorporated by reference into this application.

BACKGROUND OF THE INVENTION

1. Field of the Invention

The present invention relates to a gate signal line driving circuit and a display device using the gate signal line driving circuit, and more particularly to a technique which realizes the suppression of noises and the prolongation of lifetime in a gate signal line driving circuit.

2. Description of the Related Art

Conventionally, for example, with respect to a liquid crystal display device, there may be a case where a so-called shift register built-in method is adopted. Here, this method is a method in which a shift register circuit provided to a gate signal line driving circuit for scanning gate signal lines is formed on the same substrate as thin film transistors (hereinafter referred to as TFTs) which are arranged in pixel regions of a display panel. A shift register circuit according to the related art is disclosed in JP 2007-95190 A.

In each one of a plurality of basic circuits which are included in a shift register circuit provided to a gate signal line driving circuit, within one frame period, only during a gate scanning period, in which a gate signal is outputted from the basic circuit to a gate signal line (hereinafter referred to as "signal HIGH period"), a HIGH voltage is outputted to the gate signal line as a gate signal $G_{out}$, and during a remaining period (hereinafter referred to as "signal LOW period"), a LOW voltage is outputted to the gate signal line as a gate signal $G_{out}$.

FIG. 11 is a schematic view simply showing the configuration of a basic circuit of a shift register circuit according to a related art. The basic circuit of the shift register circuit includes a LOW voltage applying switching element SWA which outputs a LOW voltage to the gate signal line corresponding to the signal LOW period, and a HIGH voltage applying switching element SWG which outputs a HIGH voltage to the gate signal line corresponding to the signal HIGH period.

A LOW voltage line $V_{GL}$ is connected to an input terminal of the LOW voltage applying switching element SWA. To enable the stable outputting of the LOW voltage during the signal LOW period with respect to the gate signal $G_{out}$ of the basic circuit, the LOW voltage applying switching element SWA is turned on in response to the signal LOW period so that a LOW voltage which is a voltage of the LOW voltage line $V_{GL}$ is outputted. Further, the LOW voltage applying switching element SWA is turned off in response to the signal HIGH period. During a period in which the LOW voltage applying switching element SWA is turned on, a HIGH voltage is applied to a switch of the LOW voltage applying switching element SWA.

A basic clock signal CLK is inputted to an input terminal of the HIGH voltage applying switching element SWG. To enable the outputting of the HIGH voltage during the signal HIGH period with respect to the corresponding gate signal line, the HIGH voltage applying switching element SWG is turned on in response to the signal HIGH period so that a voltage of the basic clock signal CLK is outputted. Here, the basic clock signal CLK assumes a HIGH voltage during the signal HIGH period. Further, the HIGH voltage applying switching element SWG is turned off in response to the signal LOW period so that the basic clock signal CLK is interrupted, or is not outputted. A HIGH voltage is applied to a switch of the HIGH voltage applying switching element SWG during a period in which the HIGH voltage applying switching element SWG is turned on, and a LOW voltage is applied to the switch of the HIGH voltage applying switching element SWG during a period in which the HIGH voltage applying switching element SWG is turned off.

To the switch of the HIGH voltage applying switching element SWG, a switching signal supply switching element SWB which supplies a LOW voltage in response to the signal LOW period is connected. The LOW voltage line $V_{GL}$ is connected to an input terminal of the switching signal supply switching element SWB. The switching signal supply switching element SWB is turned on in response to the signal LOW period so that a LOW voltage is applied to a switch of the HIGH voltage applying switching element SWG. Further, the switching signal supply switching element SWB is turned off in response to the signal HIGH period. During a period in which the switching signal supply switching element SWB is turned on, a HIGH voltage is applied to a switch of the switching signal supply switching element SWB.

FIG. 12 is a circuit diagram of a basic circuit of a shift register circuit according to a related art. As shown in the drawing, a transistor T6 provided to a LOW voltage applying switching circuit 211 corresponds to the LOW voltage applying switching element SWA. A node N2 is held at a HIGH voltage in response to a signal LOW period, and a LOW voltage of a LOW voltage line $V_{GL}$ is outputted from an output terminal OUT as a gate signal $G_n$.

Further, as shown in the drawing, a transistor T5 provided to a HIGH voltage applying switching circuit 212 corresponds to the HIGH voltage applying switching element SWG. A node N1 assumes a HIGH voltage in response to a signal HIGH period, and a voltage of a basic clock signal CLK1 inputted from an input terminal IN1 is outputted from the output terminal OUT as a gate signal $G_n$.

Further, as shown in the drawing, a transistor T2 provided to a switching signal supply switching circuit 213 corresponds to the switching signal supply switching element SWB. A node N2 is held at a HIGH voltage in response to the signal LOW period, and a LOW voltage of a LOW voltage line $V_{GL}$ is applied to the node N1.

SUMMARY OF THE INVENTION

The signal LOW period occupies most of the period within one frame period and hence, the LOW voltage applying switching element SWA and the switching signal supply switching element SWB are held in an ON state for a long time. During this period, a HIGH voltage is applied to the switch of the LOW voltage applying switching element SWA and the switch of the switching signal supply switching element SWB for a long time.

When a HIGH voltage is applied to a specified element for a long time in a circuit, in general, the degradation of the characteristics of the element starts earlier. When driving ability of a switching element which performs an ON operation or an OFF operation becomes insufficient, it is not possible to cut a noise signal from other elements and hence, the performance of the circuit as a gate signal line driving circuit is degraded including a case where a noise signal is mixed into a gate signal $G_{out}$.

Further, the characteristics of the element are degraded along with the driving of the element, and when the element is driven exceeding a driving time limit, the lifetime of the element ends. When the lifetime of the specified element ends and the element cannot exhibit the driving ability, the lifetime of the whole gate signal line driving circuit is decided based on the element.

The present invention has been made to overcome such drawbacks, and it is an object of the present invention to provide a gate signal line driving circuit which can delay the degradation of a switching element to which a HIGH voltage is applied for a long time, can suppress lowering of the performance thereof, and can realize the prolongation of lifetime thereof, and a display device using the gate signal line driving circuit.

(1) According to one aspect of the present invention, a gate signal line driving circuit which applies a HIGH voltage to a gate signal line during a signal HIGH period, and applies a LOW voltage to the gate signal line during a signal LOW period which is a period other than the signal HIGH period, includes: a plurality of LOW voltage applying switching elements which are connected in parallel with respect to the gate signal line, and apply a LOW voltage to the gate signal line in an ON state respectively, wherein at least one of the plurality of LOW voltage applying switching elements is brought into an ON state in response to the signal LOW period, and at least one of the plurality of LOW voltage applying switching elements is brought into an OFF state within at least a section of the signal LOW period.

(2) In the gate signal line driving circuit according to Item (1), a HIGH voltage may be applied to an input terminal of said each LOW voltage applying switching element when the LOW voltage applying switching element assumes an OFF state.

(3) The gate signal line driving circuit according to Item (1), may further includes: a HIGH voltage applying switching element which is connected to the gate signal line, assumes an ON state in response to the signal HIGH period and applies a HIGH voltage to the gate signal line, and assumes an OFF state in response to the signal LOW period; and a plurality of switching signal supply switching elements which are connected in parallel with respect to the HIGH voltage applying switching elements, and apply a LOW voltage to a switch terminal of the HIGH voltage applying switching element in an ON state respectively; wherein at least one of the plurality of switching signal supply switching elements is brought into an ON state in response to the signal LOW period, and at least one of the plurality of switching signal supply switching elements is brought into an OFF state within at least a section of the signal LOW period.

(4) In the gate signal line driving circuit according to Item (3), a HIGH voltage may be applied to an input terminal of said each LOW voltage applying switching element when the LOW voltage applying switching element assumes an OFF state; and a HIGH voltage may be applied to an input terminal of said each switching signal supply switching elements when the switching signal supply switching element assumes an OFF state.

(5) The gate signal line driving circuit according to Item (1), may further include: a plurality of control switching elements which are respectively connected to switch terminals of the plurality of LOW voltage applying switching elements, wherein a control voltage outputting circuit which applies a HIGH voltage to switch terminals of said respective LOW voltage applying switching elements by way of the respective control switching elements, wherein the control voltage outputting circuit may include a holding capacitor which holds the HIGH voltage; said respective control switching elements may be connected in parallel with respect to an output terminal of the control voltage outputting circuit and may be turned on and off alternately; and an electric charge may be supplied to the holding capacitor in response to switching timing of the control switching element.

(6) A display device may be provided with the gate signal line driving circuit according to Item (1).

DESCRIPTION OF THE PREFERRED EMBODIMENTS

First Embodiment

Figure 1:
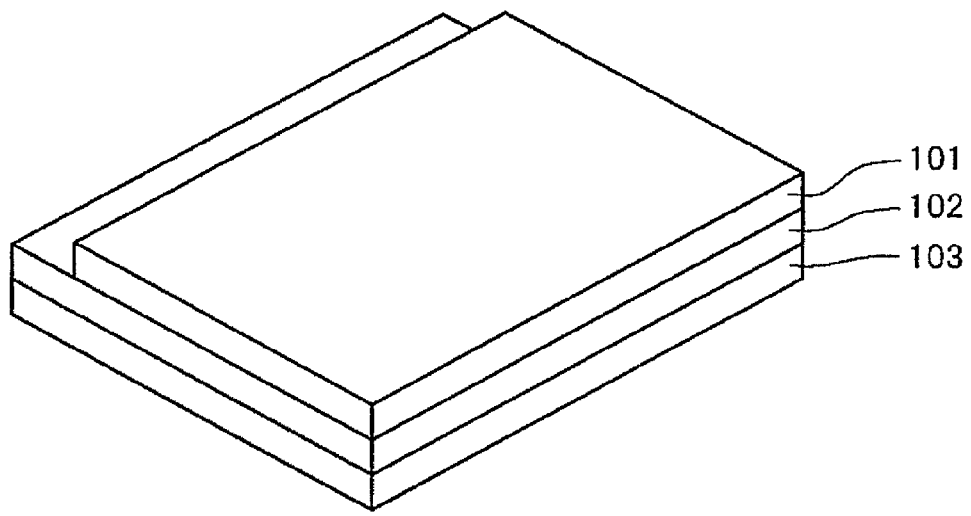
FIG. 1 is a perspective view showing the whole configuration of a liquid crystal display device according to an embodiment of the present invention.

A display device according to a first embodiment of the present invention is, for example, an IPS (In-Plane Switching) liquid crystal display device. As shown in FIG. 1 which is a perspective view showing the whole configuration of the liquid crystal display device, the liquid crystal display device includes: a TFT substrate 102 on which gate signal lines 105, video signal lines 107, pixel electrodes 110, common electrodes 111, TFTs 109 and the like are arranged; a filter substrate 101 which are opposed to the TFT substrate 102 and mounts color filters thereon; a liquid crystal material which is sealed in a region sandwiched between both the substrates; and a backlight 103 which is positioned such that the backlight 103 is brought into contact with a side of the TFT substrate 102 opposite to a filter-substrate—101 side of the TFT substrate 102.

Figure 2:
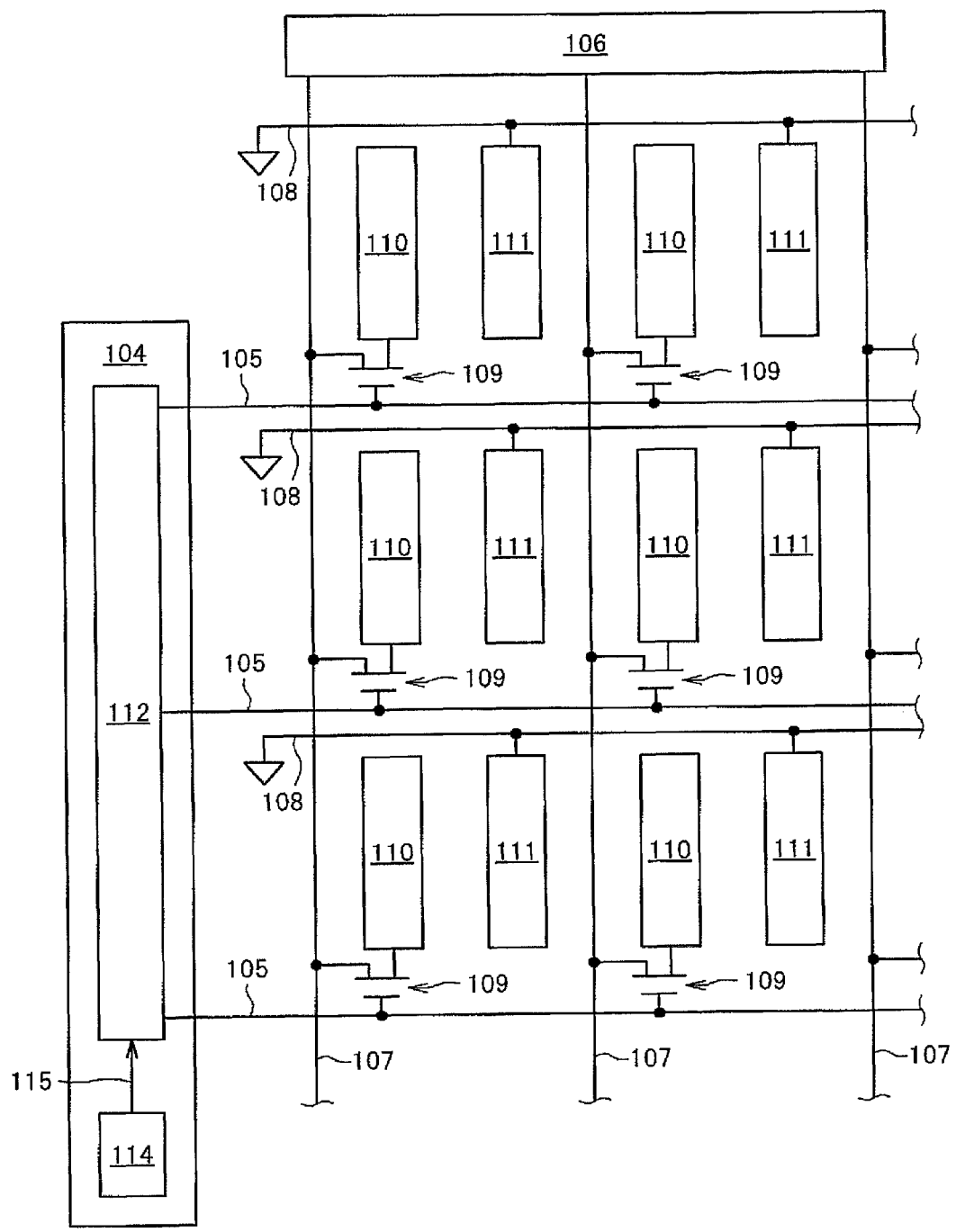
FIG. 2 is a conceptual view of an equivalent circuit of a TFT substrate provided to the liquid crystal display device according to the embodiment of the present invention.

FIG. 2 is a conceptual view of an equivalent circuit of the TFT substrate 102. In FIG. 2, on the TFT substrate 102, a plurality of gate signal lines 105 which are connected to a gate signal line driving circuit 104 are arranged parallel to each other at equal intervals and extend in the lateral direction in the drawing.

The gate signal line driving circuit 104 includes a shift register control circuit 114 and a shift register circuit 112. The shift register control circuit 114 outputs a plurality of control signals 115 described later to the shift register circuit 112.

The shift register circuit 112 includes a plurality of basic circuits 113 corresponding to the plurality of gate signal lines 105 respectively. For example, when there are 800 pieces of gate signal lines 105, the shift register circuit 112 includes the corresponding number of basic circuits 113, that is, 800 pieces of basic circuits 113. In response to a plurality of control signals 115 inputted from the shift register control circuit 114, each basic circuit 113 outputs a gate signal to the corresponding gate signal line 105, wherein within one frame period, the gate signal assumes a HIGH voltage in a corresponding gate scanning period (signal HIGH period) and assumes a LOW voltage in other period (signal LOW period).

Further, a plurality of video signal lines 107 which are connected to a data driving circuit 106 are arranged parallel to each other at equal intervals and extend in the longitudinal direction in the drawing. Pixel regions which are arranged in a matrix array are respectively defined by these gate signal lines 105 and the video signal lines 107. Further, common signal lines 108 extend parallel to the respective gate signal lines 105 in the lateral direction in the drawing.

At a corner in each pixel region which is defined by the gate signal lines 105 and the video signal lines 107, a TFT 109 is formed. The TFT 109 is connected to the corresponding video signal line 107 and a pixel electrode 110. Further, a gate electrode of the TFT 109 is connected to the corresponding gate signal line 105. In each pixel region, a common electrode 111 is formed such that the common electrode 111 are opposed to the pixel electrode 110.

In the above-mentioned circuit configuration, a reference voltage is applied to the common electrodes 111 of the respective pixel circuits via the corresponding common signal lines 108. Further, by selectively applying a gate voltage to the gate electrode of the TFT 109 via the corresponding gate signal line 105, an electric current which flows in the TFT 109 can be controlled. A voltage of a video signal which is supplied to the video signal line 107 is applied to the pixel electrode 110 via the TFT 109 in which a gate voltage is applied to the gate electrode thereof. Accordingly, a potential difference is generated between the pixel electrode 110 and the common electrode 111 so that alignment of liquid crystal molecules and the like are controlled whereby the degree of transmission of light from the backlight 103 is controlled thus enabling the display of an image.

Figure 3:
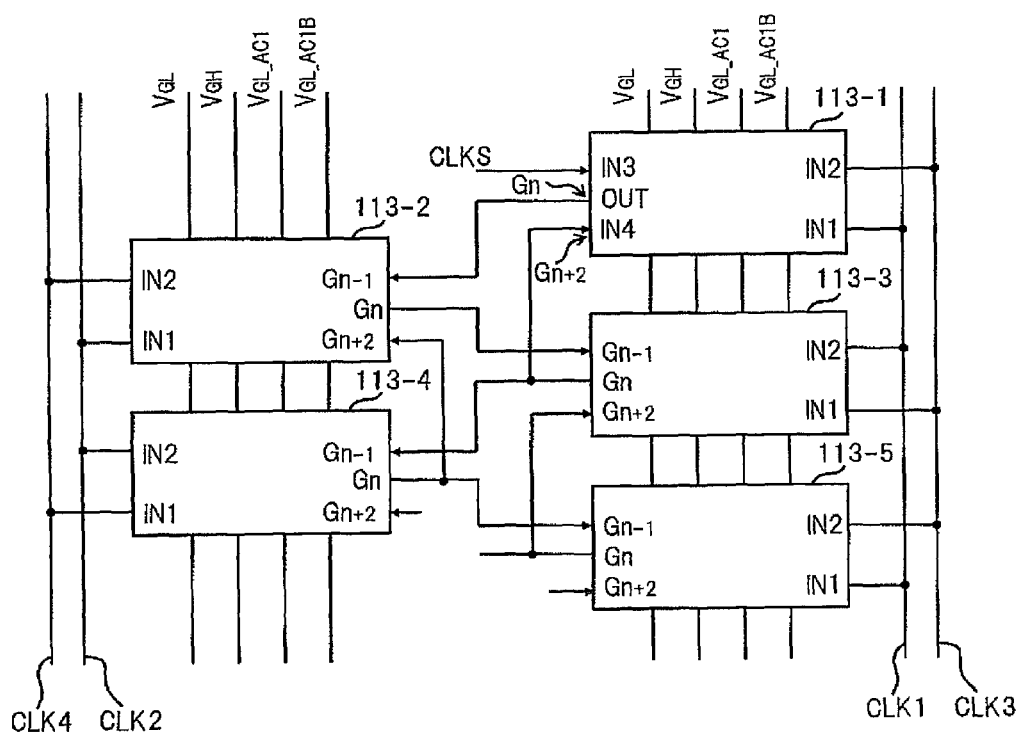
FIG. 3 is a block diagram of a shift register circuit according to the embodiment of the present invention.

FIG. 3 is a block diagram of the shift register circuit 112. For example, when there are 800 pieces of gate signal lines 105, the shift register circuit 112 includes 800 pieces of basic circuits 113 which respectively correspond to the 800 pieces of gate signal lines 105. In FIG. 3, out of 800 pieces of basic circuits 113, 5 pieces ($n=1$ to $n=5$) of basic circuits 113 are shown. In FIG. 3, the n-th basic circuit is indicated as the basic circuit 113-$n$.

The plurality of control signals 115 which the shift register control circuit 114 outputs to the shift register circuit 112 includes four basic clock signals CLK1, CLK2, CLK3, CLK4 having phases different from each other, a HIGH voltage line $V_{GH}$, a LOW voltage line $V_{GL}$, a pair of AC voltage lines $V_{GL\_AC1}, V_{GL\_AC1B}$ being opposite in phase from each other, and a plurality of auxiliary signals CLKS.

Each basic circuit 113 shown in FIG. 3 includes, as can be understood from the first basic circuit 113-1 in the drawing, 4 pieces of input terminals IN1, IN2, IN3 and IN4, and one output terminal OUT. Further, a HIGH voltage line $V_{GH}$, a LOW voltage line $V_{GL}$, and a pair of AC voltage lines $V_{GL\_AC1}, V_{GL\_AC1B}$, are respectively connected to each basic circuit.

Input terminals IN1, IN2 of the n-th basic circuit 113-$n$ are explained. When n satisfies $n=4m-3$ ($m=1, 2, \ldots, 200$), the basic clock signals CLK1, CLK3 are respectively inputted to the input terminals IN1, IN2. In the same manner, when n satisfies $n=4m-2$, the basic clock signals CLK2, CLK4 are inputted to the input terminals IN1, IN2, when n satisfies $n=4m-1$, the basic clock signals CLK3, CLK1 are inputted to the input terminals IN1, IN2, and when n satisfies $n=4m$, the basic clock signals CLK4, CLK2 are inputted to the input terminals IN1, IN2, respectively.

A gate signal which is outputted from the output terminal OUT of the n-th basic circuit 113-$n$ is defined as "$G_n$". To the input terminal IN3 of the n-th basic circuit 113-$n$, a gate signal $G_{n-1}$ from the (n−1)th basic circuit 113-($n-1$) is inputted. In the same manner, to the input terminal IN4, a gate signal $G_{n+2}$ from (n+2)th basic circuit 113-($n+2$) is inputted. Here, there is no gate signal corresponding to the input terminal IN3 of the first basic circuit 113-1 and hence, an auxiliary signal CLKS is inputted to the input terminal IN3. In the same manner, an output $G_{801}$ of a 801st dummy circuit is inputted to the input terminal IN4 of a 799th basic circuit 113-799, an output $G_{802}$ of a 802nd dummy circuit is inputted to the input terminal IN4 of a 800th basic circuit 113-800 respectively. Other auxiliary signals CLKS are inputted to the input terminals IN4 of the 801st dummy basic circuit 113-801 and the 802nd dummy basic circuit 113-802, respectively.

Figure 4:
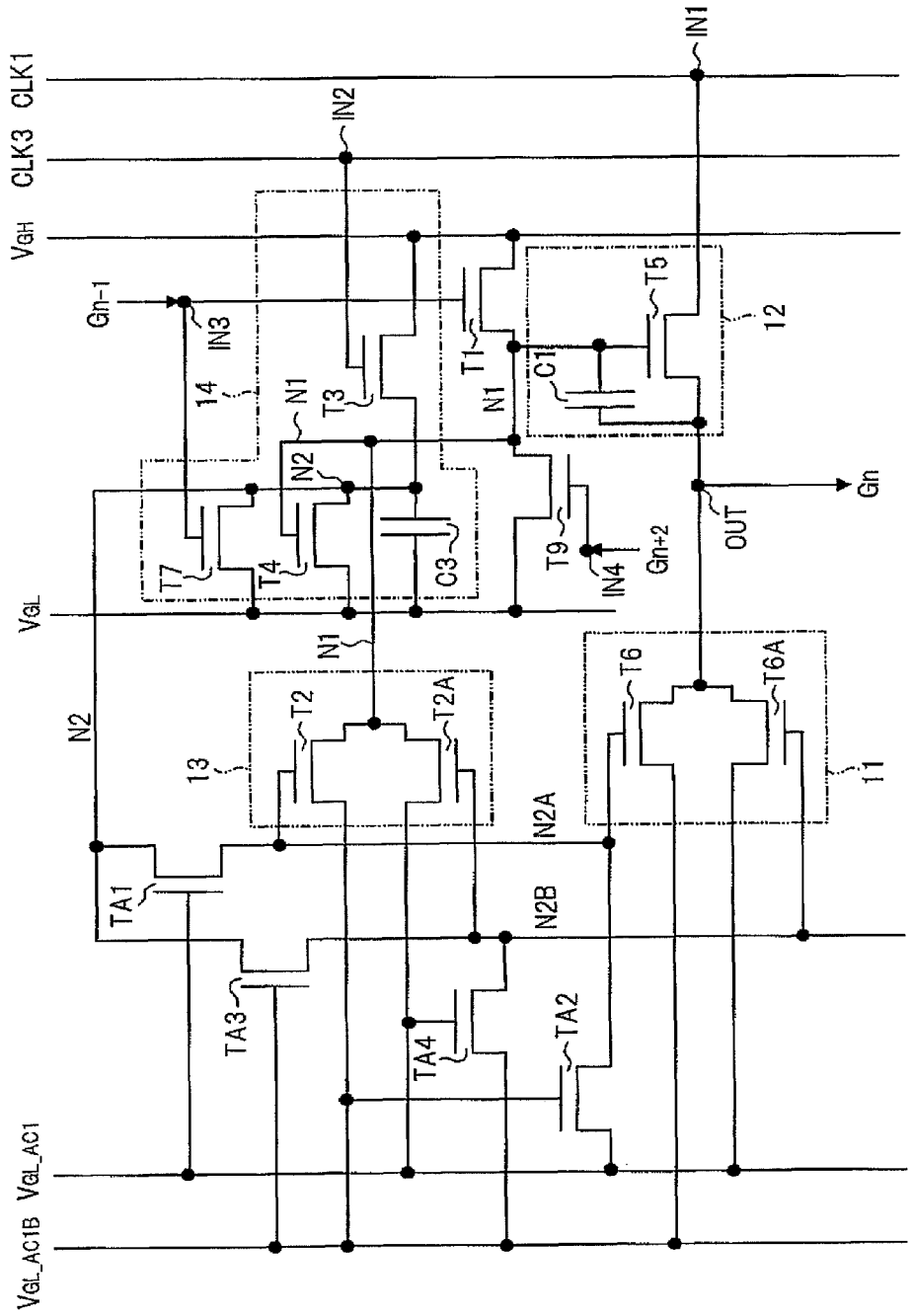
FIG. 4 is a circuit diagram of a basic circuit of the shift register circuit according to a first embodiment of the present invention.

FIG. 4 is a circuit diagram showing the n-th basic circuit 113-$n$ of the shift register circuit 112. FIG. 4 shows a case where "n" satisfies $n=4m-3$. Also in a case where "n" takes another value, the manner of operation is substantially equal to the manner of operation shown in FIG. 4 except for that basic clocks inputted to the input terminals IN1, IN2 are different from the basic clocks used in the case shown in FIG. 4.

The main difference between the basic circuit of this embodiment and the basic circuit of the shift register circuit according to the related art shown in FIG. 12 lies in the following point. In the basic circuit according to the related art, the LOW voltage applying switching circuit 211 includes only the transistor T6 which corresponds to the LOW voltage applying switching element SWA. On the other hand, in the basic circuit 113 according to this embodiment, a LOW voltage applying switching circuit 11 includes two transistors T6, T6A which are connected parallel to each other. In the same manner, in the basic circuit according to the related art, the switching signal supply switching circuit 213 includes the transistor T2 which corresponds to the switching signal supply switching element SWB. On the other hand, in the basic circuit 113 according to this embodiment, a switching signal supply switching circuit 13 includes two transistors T2, T2A which are connected parallel to each other.

These transistors are connected to the pair of AC voltage lines $V_{GL\_AC1}$, $V_{GL\_AC1B}$ via the transistors TA1, TA2, TA3 and TA4 which operate as control switching elements. The pair of AC voltage lines $V_{GL\_AC1}$, $V_{GL\_AC1B}$ are opposite in phase from each other, and alternately and repeatedly assume a HIGH voltage and a LOW voltage.

Figure 5:
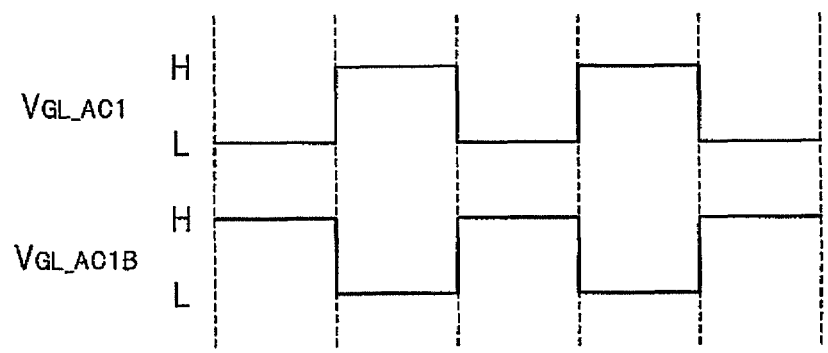
FIG. 5 is a timing chart showing a change in voltage with time of a pair of AC voltage lines according to the first embodiment of the present invention.

FIG. 5 is a view showing a change in voltage with time of the pair of AC voltage lines $V_{GL\_AC1}$, $V_{GL\_AC1B}$. Time is taken on an axis of abscissas, and a HIGH voltage (H) and a LOW voltage (L) of the pair of AC voltage lines $V_{GL\_AC1}$, $V_{GL\_AC1B}$ are taken on an axis of ordinates. As shown in the drawing, when the AC voltage line $V_{GL\_AC1}$ assumes a HIGH voltage (LOW voltage), the AC voltage line $V_{GL\_AC1B}$ assumes a LOW voltage (HIGH voltage), that is, the AC voltage lines $V_{GL\_AC1}$, $V_{GL\_AC1B}$ are opposite in phase from each other. Further, with respect to the respective AC voltage lines $V_{GL\_AC1}$, $V_{GL\_AC1B}$, a HIGH voltage and a LOW voltage are periodically and alternately changed at equal time intervals.

When the AC voltage line $V_{GL\_AC1}$ assumes a HIGH voltage and the AC voltage line $V_{GL\_AC1B}$ assumes a LOW voltage, the transistor T6 is driven as the LOW voltage applying switching element SWA, and the transistor T2 is driven as the switching signal supply switching element SWB, in response to a signal LOW period. On the other hand, when the AC voltage line $V_{GL\_AC1}$ assumes a LOW voltage and the AC voltage line $V_{GL\_AC1B}$ assumes a HIGH voltage, the transistor T6A is driven as the LOW voltage applying switching element SWA, and the transistor T2A is driven as the switching signal supply switching element SWB, in response to a signal LOW period.

Here, the explanation is made with respect to a case where the AC voltage line $V_{GL\_AC1}$ assumes a HIGH voltage and the AC voltage line $V_{GL\_AC1B}$ assumes a LOW voltage. As shown in FIG. 4, gate electrodes of the transistors TA1, TA4 are connected to the AC voltage line $V_{GL\_AC1}$, and gate electrodes of the transistors TA2, TA3 are connected to the AC voltage line $V_{GL\_AC1B}$. Here, a HIGH voltage of the AC voltage line $V_{GL\_AC1}$ is applied to the gate electrodes of the transistors TA1, TA4 so that these transistors TA1, TA4 are turned on. A node N2 and a node N2A are connected to both input and output terminals of the transistor TA1, respectively. When the transistor TA1 is turned on, the node N2A is electrically connected to the node N2. The AC voltage line $V_{GL\_AC1B}$ is connected to an input terminal of the transistor TA4, and a node N2B is connected to an output terminal of the transistor TA4. When the transistor TA4 is turned on, a LOW voltage of the AC voltage line $V_{GL\_AC1B}$ is applied to the node N2B. Here, a LOW voltage of the AC voltage line $V_{GL\_AC1B}$ is applied to the gate electrodes of the transistors TA2, TA3 and hence, the transistors TA2, TA3 are held in an OFF state.

The node N2A is connected to gate electrodes of the transistors T2, T6, and the node N2B is connected to gate electrodes of the transistors T2A, T6A. As described later, the node N2 assumes a HIGH voltage in response to a signal LOW period and assumes a LOW voltage in response to a signal HIGH period. The node N2A is electrically connected to the node N2 and hence, a voltage of the node N2A is changed along with a voltage of the node N2. Accordingly, a HIGH voltage is applied to the gate electrodes of the transistors T2, T6 in response to a signal LOW period so that the transistors T2, T6 are turned on. On the other hand, the node N2B assumes a LOW voltage and hence, a LOW voltage is applied to the gate electrodes of the transistors T2A, T6A so that the transistors T2A, T6A are held in an OFF state.

The AC voltage line $V_{GL\_AC1B}$ is connected to an input terminal of the transistor T6. In response to a signal LOW period, the node N2 assumes a HIGH voltage so that the transistor T6 is turned on whereby a LOW voltage of the AC voltage line $V_{GL\_AC1B}$ is outputted from an output terminal OUT as a gate signal $G_n$. In response to a signal HIGH period, the node N2 assumes a LOW voltage so that the transistor T6 is turned off.

Further, the n-th basic circuit 113-n includes a HIGH voltage applying switching circuit 12, and the HIGH voltage applying switching circuit 12 includes a transistor T5 and a boosting capacitor C1, wherein the transistor T5 operates as the HIGH voltage applying switching element SWG.

The input terminal IN1 is connected to an input terminal of the transistor T5, and The basic clock signal CLK1 is inputted to the input terminal IN1. A voltage of a node N1 is applied to a gate electrode of the transistor T5. The node N1 assumes a HIGH voltage in response to a signal HIGH period. Here, a HIGH voltage of the node N1 is applied to the gate electrode of the transistor T5 so that the transistor T5 is turned on whereby a signal of the basic clock signal CLK1 is outputted from the output terminal OUT as a gate signal $G_n$. Further, the node N1 assumes a LOW voltage in response to a signal LOW period. Here, the transistor T5 is turned off.

The switching signal supply switching circuit 13 performs a function of controlling the node N1 to a LOW voltage. The AC voltage line $V_{GL\_AC1B}$ is connected to an input terminal of the transistor T2 provided to the switching signal supply switching circuit 13. In the same manner as the transistor T6, in response to a signal LOW period, the node N2 assumes a HIGH voltage so that the transistor T2 is turned on whereby a LOW voltage of the AC voltage line $V_{GL\_AC1B}$ is applied to the gate electrode of the transistor T5 as a voltage of the node N1, and the transistor T5 is turned off. Further, in response to a signal HIGH period, the transistor T2 is turned off.

In this manner, in response to a signal HIGH period, the node N1 assumes a HIGH voltage and the node N2 assumes a LOW voltage, while in response to a signal LOW period, the node N1 assumes a LOW voltage and the node N2 is held at a HIGH voltage. Other transistors and another capacitor shown in the drawings are provided for controlling these nodes. Particularly, a control voltage output circuit 14 includes transistors T3, T4 and T7 and a holding capacitor C3. The node N2 is controlled to a HIGH voltage by the control voltage output circuit 14.

Figure 6:
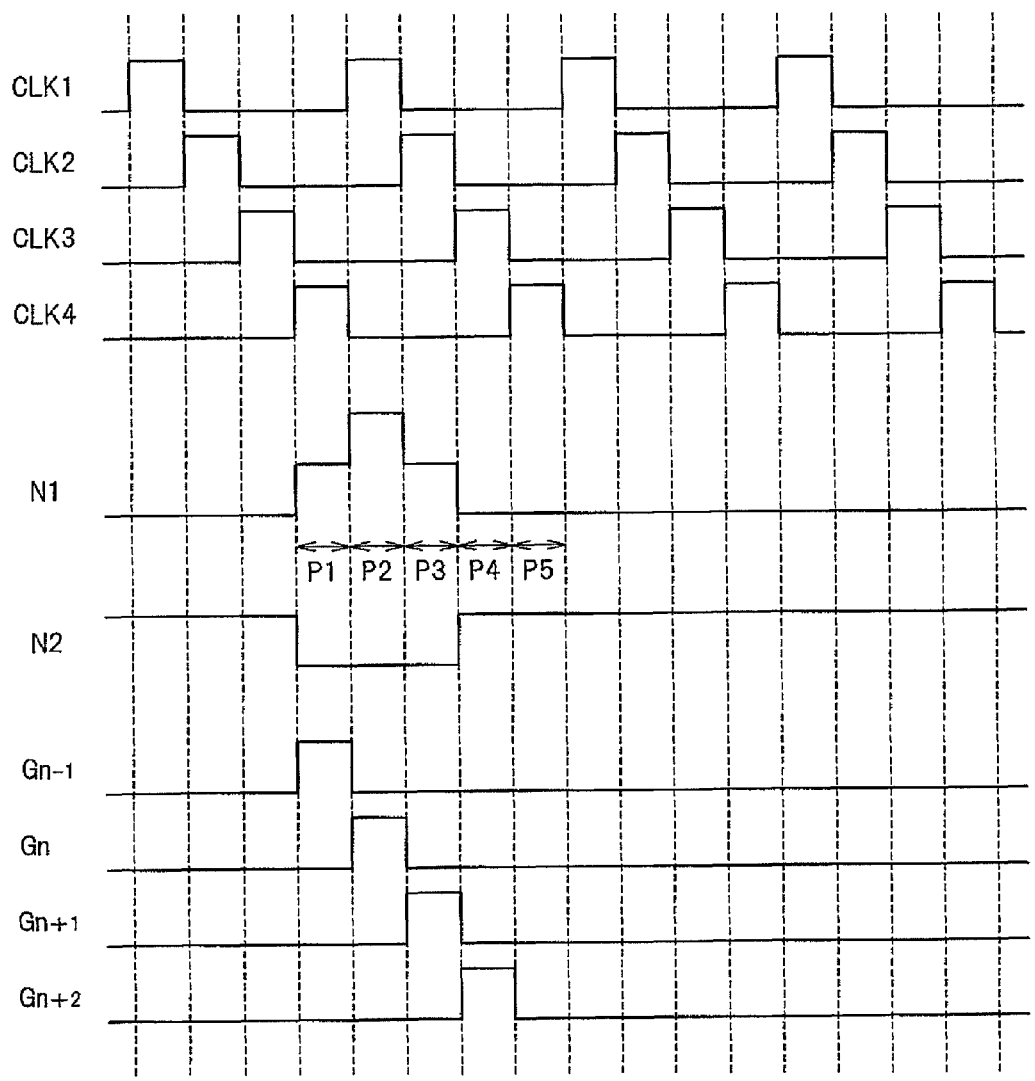
FIG. 6 is a timing chart showing a change in voltage with time of an input signal, voltages of nodes and voltages of gate signals according to the basic circuit of the shift register circuit according to the first embodiment of the present invention.

FIG. 6 shows a change with time in voltages of the nodes N1, N2 of the n-th basic circuit 113-n where n satisfies n=4m−3 together with the basic clock signals which are input signals and gate signals of the neighboring basic circuits. Hereinafter, the manner of operation of the basic circuit 113 is explained together with a change with time in respective signals shown in FIG. 6.

As shown in FIG. 4, the input terminal IN3 is connected to gate electrodes of the transistors T1, T7, and a gate signal $G_{n-1}$ from the preceding basic circuit 113-(n−1) is inputted to the input terminal IN3. The gate signal $G_{n-1}$ assumes a HIGH voltage during a period P1 shown in FIG. 6 so that two transistors T1, T7 are turned on during the period P1.

A HIGH voltage line $V_{GH}$ is connected to an input terminal of the transistor T1, and a LOW voltage line $V_{GL}$ is connected to an input terminal of the transistor T7. Accordingly, when the transistors T1 and T7 are turned on, a HIGH voltage of the HIGH voltage line $V_{GH}$ is applied to the node N1, while a LOW voltage of the LOW voltage line $V_{GL}$ is applied to the node N2.

During a period P2 which is a signal HIGH period, the node N1 is held at a HIGH voltage, and the transistor T5 is held in an ON state. During the period P2, the basic clock signal CLK1 which is inputted to the input terminal IN1 assumes a HIGH voltage. Accordingly, during the period P2, a HIGH voltage of the basic clock signal CLK1 is outputted from the output terminal OUT as a gate signal $G_n$ via the transistor T5.

Here, in an actual operation, because of setting of a threshold voltage $V_{th}$ in the transistor T1, in the period P1, a voltage of the node N1 assumes a voltage which is obtained by subtracting the threshold voltage $V_{th}$ of the transistor T1 from a HIGH voltage of the HIGH voltage line $V_{GH}$. With such a voltage, there exists a possibility that the transistor T5 cannot be sufficiently turned on in the period P2 which is the signal HIGH period. To cope with such a possibility, the boosting capacitor C1 is connected to the HIGH voltage applying switching circuit 12 parallel to the transistor T5. Accordingly, in the period P2, although a gate signal $G_{n-1}$ is changed to a LOW voltage so that the transistor T1 is turned off, the node N1 is held at a HIGH voltage so that the transistor T5 is held in an ON state. During the period P2, a HIGH voltage of the basic clock signal CLK1 which is inputted to the input terminal IN1 is applied to the output terminal OUT, and the node N1 is boosted to a higher voltage due to a capacitive coupling of the boosting capacitor C1. This voltage is referred to as a bootstrap voltage.

As shown in FIG. 4, the LOW voltage line $V_{GL}$ is connected to an input terminal of the transistor T4, and a voltage of the node N1 is applied to a gate electrode of the transistor T4. Accordingly, during a period where the node N1 assumes a HIGH voltage, that is, during periods P1, P2 and P3, the transistor T4 is turned on, a LOW voltage of the LOW voltage line $V_{GL}$ is outputted, and the node N2 is held at a LOW voltage even after the transistor T7 is turned off.

As shown in FIG. 4, the LOW voltage line $V_{GL}$ is connected to an input terminal of a transistor T9, and the input terminal IN4 is connected to a gate electrode of the transistor T9. A gate signal $G_{n+2}$ from the second next basic circuit 113-(n+2) is inputted to the input terminal IN4.

As shown in FIG. 6, the gate signal $G_{n+2}$ assumes a HIGH voltage during a period P4 and hence, during the period P4, the transistor T9 is turned on and a LOW voltage of the LOW voltage line $V_{GL}$ is applied to the node N1. Accordingly, the transistor T5 is turned off. Further, the transistor T4 is also turned off simultaneously.

As shown in FIG. 4, between the LOW voltage line $V_{GL}$ and the HIGH voltage line $V_{GH}$, the holding capacitor C3 and the transistor T3 provided to the control voltage output circuit 14 are connected in series. An output terminal of the transistor T3 and a positive pole of the holding capacitor C3 are connected to the node N2. Further, the LOW voltage line $V_{GL}$ is connected to a negative pole of the holding capacitor C3, and the HIGH voltage line $V_{GH}$ is connected to an input terminal of the transistor T3. The input terminal IN2 is connected to a gate electrode of the transistor T3, and the basic clock signal CLK3 is inputted to the input terminal IN2.

Since the basic clock signal CLK3 assumes a HIGH voltage during the period P4, the transistor T3 is turned on during the period P4 so that a voltage of the node N2 is changed to a HIGH voltage. Simultaneously, the holding capacitor C3 is charged with a HIGH voltage.

Thereafter, the basic clock signal CLK3 is changed to a LOW voltage in the period P5 and the transistor T3 is turned off. Even after the transistor T3 is turned off, a voltage of the node N2 is held at a HIGH voltage due to the holding capacitor C3. Further, the basic clock signal CLK3 periodically assumes a HIGH voltage so as to periodically charge the holding capacitor C3 and hence, the voltage of the node N2 is held at a HIGH voltage.

As described above, in response to the signal HIGH period, during the periods P1, P2 and P3, the node N1 assumes a HIGH voltage, and the transistor T5 which operates as the HIGH voltage applying switching element SWG, is turned on. During the periods P1, P2 and P3, a voltage of the basic clock signal CLK1 is outputted from the output terminal OUT as a gate signal $G_n$. Particularly, during the period P2, the basic clock signal CLK1 assumes a HIGH voltage and hence, the gate signal $G_n$ also assumes a HIGH voltage. Further, during the periods P1, P2 and P3, the node N2 assumes a LOW voltage so that the transistor T6 which operates as the LOW voltage applying switching element SWA, and the transistor T2 which operates as the switching signal supply switching element SWB, are turned off.

Further, in response to a signal LOW period, that is, during periods other than the periods P1, P2 and P3 within 1 frame period, the node N2 is held at a HIGH voltage so that the transistor T2 is turned on whereby the node N1 is held at a LOW voltage. Simultaneously, the transistor T6 is turned on so that a LOW voltage of the AC voltage line $V_{GL\_AC1B}$ is outputted as a gate signal $G_n$ from the output terminal OUT. Then, in most of the 1 frame period, a HIGH voltage is applied to a gate electrode of the transistor T6 and a gate electrode of the transistor T2.

The explanation has been made heretofore in a case where the AC voltage line $V_{GL\_AC1}$ assumes a HIGH voltage, and the AC voltage line $V_{GL\_AC1B}$ assumes a LOW voltage. To the contrary, when the AC voltage line $V_{GL\_AC1}$ assumes a LOW voltage, and the AC voltage line $V_{GL\_AC1B}$ assumes a HIGH voltage, a HIGH voltage of the AC voltage line $V_{GL\_AC1B}$ is applied to the gate electrodes of the transistors TA2, TA3 so that the transistors TA2, TA3 are turned on. The node N2 and the node N2B are connected to both input and output terminals of the transistor TA3, respectively. When the transistor TA3 is turned on, the node N2B is electrically connected to the node N2. The AC voltage line $V_{GL\_AC1}$ is connected to an input terminal of the transistor TA2, and the node N2A is connected to an output terminal of the transistor TA2. When the transistor TA2 is turned on, a LOW voltage of the AC voltage line $V_{GL\_AC1}$ is applied to the node N2A. Here, since a LOW voltage of the AC voltage line $V_{GL\_AC1}$ is applied to the gate electrodes of the transistors TA1, TA4, the transistors TA1, TA4 are held in an OFF state.

Here, in response to a signal LOW period, the transistors T2A, T6A are turned on, while the transistors T2, T6 are held in an OFF state.

In this case, in response to a signal LOW period, the transistor T6A is driven in place of the transistor T6 as the low voltage applying switching element SWA, and the transistor T2A is driven in place of the transistor T2 as the switching signal supply switching element SWB. However, other operations are performed in the same manner as the above-mentioned operation. Then, along with a change in voltages of the pair of AC voltage lines $V_{GL\_AC1}$, $V_{GL\_AC1B}$, the driven switching elements are sequentially repeated and changed over.

Figure 12:
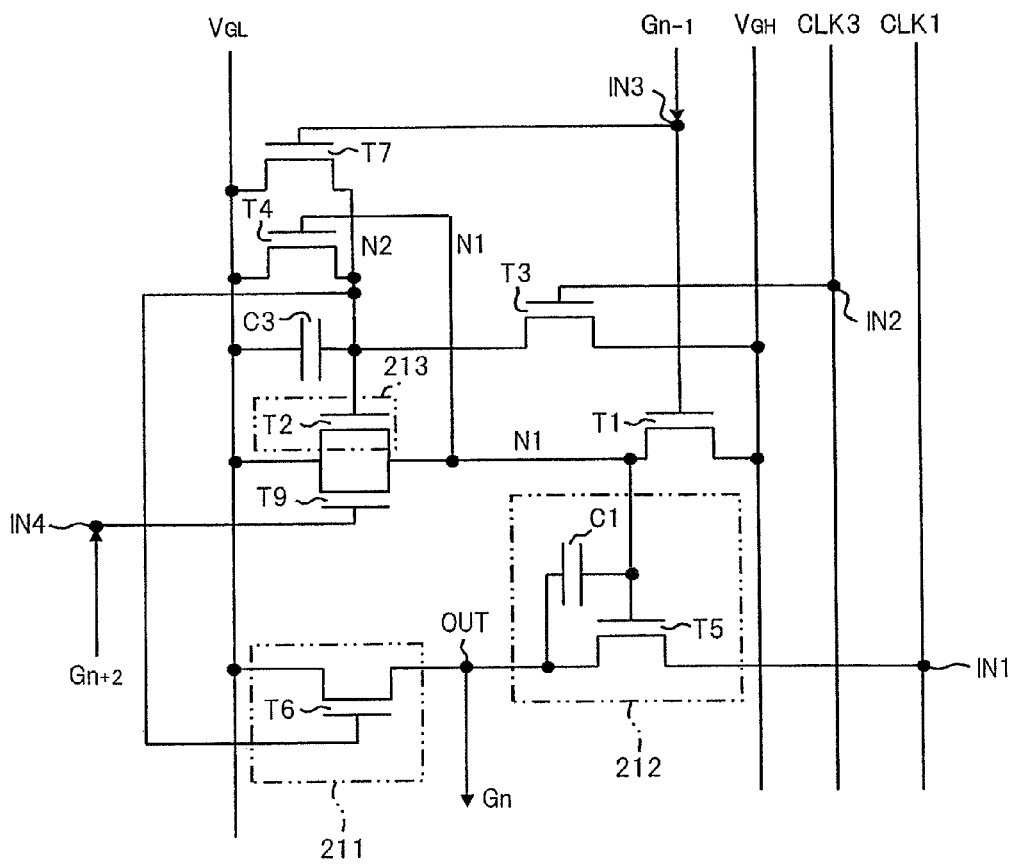
FIG. 12 is a circuit diagram showing one example of the basic configuration of the shift register circuit according to the related art.

In a basic circuit 113 according to the related art shown in FIG. 12, a HIGH voltage is applied to the gate electrodes of the transistors T2, T6 for a long time. On the other hand, as described above, in the basic circuit 113 according to this embodiment shown in FIG. 4, it is possible to divide the time during which a HIGH voltage is applied to gate electrodes of transistors between the transistors T2, T6 and the transistors T2A, T6A, respectively. Accordingly, the time which causes the degeneration of the switching elements can be delayed or the lifetime of the switching elements can be prolonged.

More particularly, when the transistors are formed of thin film transistors (TFTs) and the semiconductor thin films in the TFTs are made of amorphous silicon (hereinafter, referred to as a-Si), the advantageous effects of the present invention are further enhanced. When a positive bias voltage is applied to the TFT made of a-Si for a long time, a threshold voltage $V_{th}$ is shifted to a HIGH voltage side. This shift is referred to as a $V_{th}$ shift. For example, when a positive bias voltage of 30V is applied to a TFT made of a-Si for 3 hours or more under an environment of 70° C., the $V_{th}$ shift generates 10V or more.

In the basic circuit 113 according to this embodiment, by dividing the time during which a HIGH voltage is applied to a gate electrode of a transistor between two transistors respectively, the time during which a HIGH voltage is applied to a gate electrode of each transistor is reduced. From this point of view, the $V_{th}$ shift can be delayed. The basic circuit 113 according to this embodiment can obtain other advantages.

For example, when the AC voltage line $V_{GL\_AC1}$ assumes a HIGH voltage and AC voltage line $V_{GL\_AC1B}$ assumes a LOW voltage, the node N2A is electrically connected to the node N2 so that the node N2B assumes a LOW voltage. Here, for example, the transistor T6 is driven as the LOW voltage applying switching element SWA so that the transistor T6A is held in an OFF state. Here, a HIGH voltage of the AC voltage line $V_{GL\_AC1}$ is applied to the input terminal of the transistor T6A, and a LOW voltage of the node N2B is applied to the gate electrode of the transistor T6A. The voltage applied to the input terminal of the transistor T6A is higher than the voltage applied to the gate electrode of the transistor T6A and hence, a reverse biased voltage is applied to the transistor T6A. When the reverse biased voltage is applied to the transistor, the $V_{th}$ shift advances in the opposite direction. That is, when the transistor is held in an OFF state, the reverse biased voltage is applied to the transistor and hence, it is possible to largely enhance the suppression of the $V_{th}$ shift.

Here, when voltages of the AC voltage lines $V_{GL\_AC1}$, $V_{GL\_AC1B}$ shown in FIG. 5 are changed from a HIGH voltage to a LOW voltage (or from a LOW voltage to a HIGH voltage), the transistor to be driven is switched. It is desirable to set this switching timing in a blanking period in which a LOW voltage is outputted as a gate signal at all of the basic circuits in the shift register circuit 112 within a frame period. Accordingly, with respect to these AC voltage lines, it is desirable that a period in which a HIGH voltage (a LOW voltage) is held continuously is integer times as long as a frame period.

With respect to the n-th basic circuit 113-*n* shown in FIG. 4, the transistors connected parallel to each other in the LOW voltage applying switching circuit 11 and the switching signal supply switching circuit 13 are constituted of two transistors respectively. Here, in the basic circuit 113, in both of the LOW voltage applying switching element and the switching signal supply switching element where a HIGH voltage is applied to the gate electrode for many hours, the time during which the HIGH voltage is applied is divided between two transistors respectively. Out of the transistors provided to the basic circuit 113, in all transistors where the HIGH voltage is applied to the gate electrodes for many hours, the time during which the HIGH voltage is applied is halved. Accordingly, the advantageous effects, that is, the suppression of noises attributed to the deterioration of the transistors and the prolongation of lifetime of the transistors can be enhanced.

However, either one of the LOW voltage applying switching element and the switching signal supply switching element may be constituted of two transistors connected parallel to each other. That is, the LOW voltage applying switching circuit 211, in the basic circuit 113 according to the related art shown in FIG. 12, may be replaced by the LOW voltage applying switching circuit 11 with the two transistors T6, T6A shown in FIG. 4. In the same manner, the switching signal supply switching circuit 213 shown in FIG. 12 may be replaced by the switching signal supply switching circuit 13 with the two transistors T2, T2A shown in FIG. 4. In either case, in two transistors arranged parallel to each other in the circuit, the time during which a HIGH voltage is applied can be halved and the advantageous effect of the present invention is obtainable with the two transistors.

Second Embodiment

The basic configuration of the display device according to the second embodiment of the present invention is equal to the configuration of the display device according to the first embodiment. On the premise of such a configuration, the display device according to the second embodiment differs from the display device according to the first embodiment with respect to a point that a plurality of control signals 115 which a shift register control circuit 114 outputs includes a further pair of AC voltage lines $V_{GL\_AC2}$, $V_{GL\_AC2B}$. Further, differently from the block diagram of the shift register circuit 112 shown in FIG. 3, these two pairs of AC voltage lines are respectively connected to each basic circuit 113.

Figure 7:
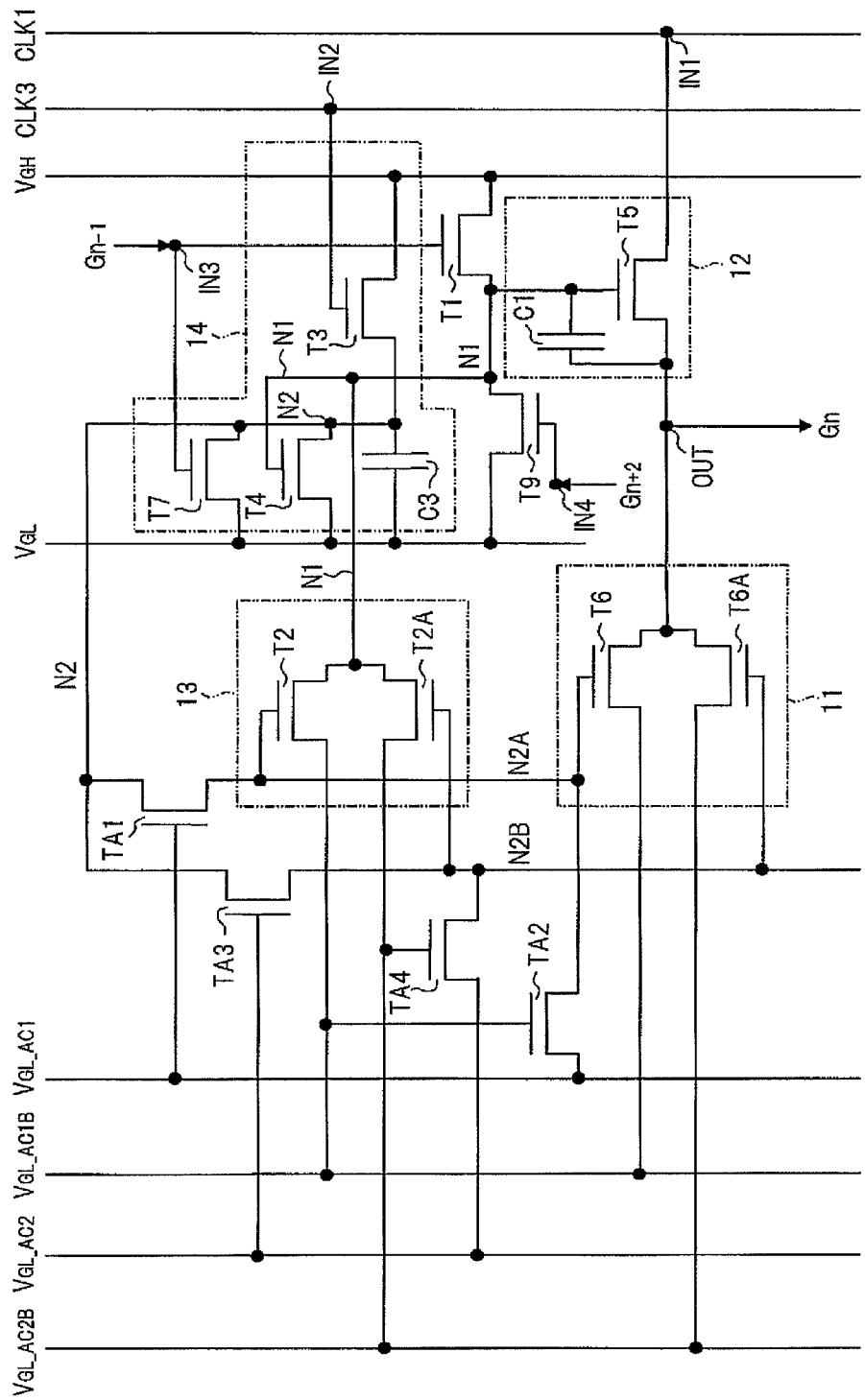
FIG. 7 is a circuit diagram of a basic circuit of the shift register circuit according to a second embodiment of the present invention.

FIG. 7 is a circuit diagram of a n-th basic circuit 113-*n* according to the second embodiment. The basic circuit 113 shown in FIG. 4 has the same basic configuration except for the following different points. Similarly to the basic circuit 113 shown in FIG. 4, two transistors T6, T6A provided to a LOW voltage applying switching circuit 11 are controlled based on voltages of nodes N2A, N2B respectively in the basic circuit 113 shown in FIG. 7. The same goes for two transistors T2, T2A provided to a switching signal supply switching circuit 13. In the basic circuit 113 according to the second embodiment shown in FIG. 7, transistors which are controlled based on a voltage of the node N2A and transistors which control the voltage of the node N2A are connected to the pair of AC voltage lines $V_{GL\_AC1}$, $V_{GL\_AC1B}$. In the same manner, transistors relating to the node N2B are also connected to the pair of the AC voltage lines $V_{GL\_AC2}$, $V_{GL\_AC2B}$. Due to such a configuration, the voltage of the node N2A and the voltage of the node N2B are independently controlled based on the two pairs of AC voltage lines, respectively.

Figure 8:
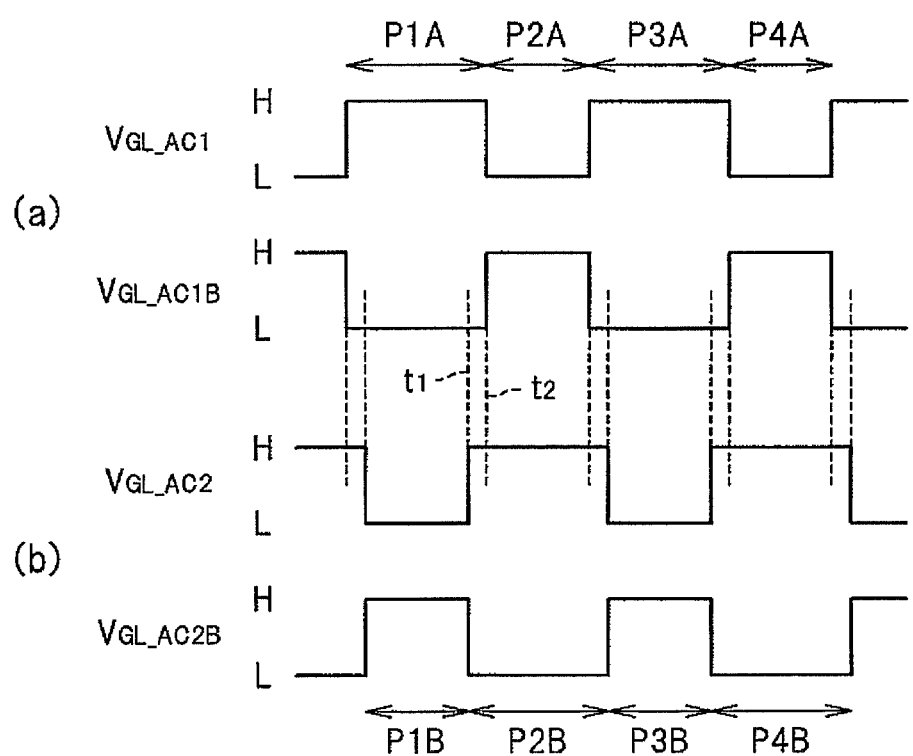
FIG. 8 is a timing chart showing a change in voltage with time of two pairs of AC voltage lines according to the second embodiment of the present invention.

FIG. 8 shows a change in voltages with time of the two pairs of AC voltage lines $V_{GL\_AC1}$, $V_{GL\_AC1B}$, $V_{GL\_AC2}$, $V_{GL\_AC2B}$. In the same manner as FIG. 5, time is taken on an axis of abscissas, and voltages of the respective AC voltage lines are taken on an axis of ordinates. As shown in FIG. 8, respective periods relating to the pair of AC voltage lines $V_{GL\_AC1}$, $V_{GL\_AC1B}$ are defined as P1A, P2A, P3A, respective periods relating to the pair of AC voltage lines $V_{GL\_AC2}$, $V_{GL\_AC2B}$ are defined as P1B, P2B, P3B, ..., and respective moments shown in the drawing are defined as $t_1$, $t_2$. As shown in FIG. 8, with respect to both of the two AC voltage lines $V_{GL\_AC1}$, $V_{GL\_AC2}$, a period during which the voltage line assumes a HIGH voltage is set longer than a period during which the voltage line assumes a LOW voltage. For example, with respect to the AC voltage lines $V_{GL\_AC1}$, the periods P1A, P3A, ... which are in a HIGH voltage state are set longer than the periods P2A, P4A, ... which are in a LOW voltage state. Further, the two AC voltage lines $V_{GL\_AC1B}$, $V_{GL\_AC2B}$ have phases opposite to phases of the two AC voltage lines $V_{GL\_AC1}$, $V_{GL\_AC2}$, respectively.

Accordingly, for example, the AC voltage line $V_{GL\_AC2}$ which assumes a LOW voltage during the period P1B is changed to a HIGH voltage at the moment $t_1$. Thereafter, the AC voltage line $V_{GL\_AC1}$ which assumes a HIGH voltage during the period P1A is changed to a LOW voltage at the moment $t_2$. That is, with respect to the AC voltage lines $V_{GL\_AC1}$, within a period in which the AC voltage lines $V_{GL\_AC1}$ is in a HIGH voltage state, overlapping periods in which both of the two AC voltage lines $V_{GL\_AC1}$, $V_{GL\_AC2}$ assume a HIGH voltage exist during some period after a voltage of the AC voltage line $V_{GL\_AC1}$ is changed from a LOW voltage to a HIGH voltage and some period immediately before a voltage of the AC voltage line $V_{GL\_AC1}$ is changed from a HIGH voltage to a LOW voltage. Similarly to the AC voltage lines $V_{GL\_AC1}$, the overlapping periods exist within a period in which the AC voltage lines $V_{GL\_AC2}$.

Hereinafter, the change of voltages at the nodes N2A, N2B is explained in accordance with a change with time shown in FIG. 8. The AC voltage line $V_{GL\_AC1}$ assumes a HIGH voltage during the period P1A and hence, a transistor TA1 is turned on and a transistor TA2 is turned off as shown in FIG. 7 so that the node N2A is electrically connected to the node N2. Further, the AC voltage line $V_{GL\_AC2}$ assumes a LOW voltage during the period P1B and hence, a transistor TA4 is turned on and a transistor TA3 is turned off as shown in FIG. 7 so that the node N2B is held at a LOW voltage.

At the moment $t_1$, a voltage of the AC voltage line $V_{GL\_AC2}$ is changed from a LOW voltage to a HIGH voltage, and a voltage of the AC voltage line $V_{GL\_AC2B}$ is changed from a HIGH voltage to a LOW voltage. Due to such a voltage change, the transistor TA3 is turned on, and the transistor TA4 is turned off so that the node N2B is electrically connected to the node N. Accordingly, the node N2 is electrically connected to both the node N2A and the node N2B. The voltage of the node N2 is held at a holding capacitor C3 provided to a switching signal supply switching circuit 13. The node N2 gets also electrically connected to the node N2B in addition to the node N2A at the moment $t_1$ and hence, the charge distribution is generated whereby a voltage of the holding capacitor C3 is lowered, a voltage of the node N2 is lowered, and a voltage of the node N2A is also lowered corresponding to the lowering of the voltage of the node N2. Here, both the node N2A and the node N2B assume a certain voltage between a HIGH voltage and a LOW voltage. That is, the transistors T2, T6 are insufficiently turned off, or the transistors T2A, T6A are insufficiently turned on. However, all input terminals of these transistors are connected to either one of the two AC voltage lines $V_{GL\_AC1B}$, $V_{GL\_AC2B}$ both of which assume a LOW voltage and hence, a stable LOW voltage is held not only at the gate signal $G_n$ and but also at the node N1.

At the moment $t_2$, a voltage of the AC voltage line $V_{GL\_AC1}$ is changed from a HIGH voltage to a LOW voltage, and a voltage of the AC voltage line $V_{GL\_AC1B}$ is changed from a LOW voltage to a HIGH voltage. Due to such a voltage change, the transistor TA1 is turned off, and the transistor TA2 is turned on so that the node N2A is changed to a LOW voltage.

Here, due to inner capacitance of the transistors T2, TA2 or the like, floating occurs before a voltage of the node N2A is changed to a LOW voltage. When the pull-down of the voltage of the node N2A is delayed due to such floating, the transistor T6 is partially brought into an ON state thus giving rise to a possibility that a part of the HIGH voltage of the AC voltage line $V_{GL\_AC1B}$ is applied to the gate signal $G_n$. That is, during a signal LOW period, noises are generated in a LOW voltage of the gate signal $G_n$ in response to a switching operation of switching elements.

However, in the basic circuit 113 according to this embodiment, the voltage of the node N2A is already lowered from a HIGH voltage in a period between the moment $t_1$ and the moment $t_2$. Accordingly, even when floating is generated due to inner capacitance immediately after the moment $t_2$, compared to a case where a voltage of the node N2A is changed from a HIGH voltage, the voltage of the node N2A is changed from a lower voltage than a HIGH voltage to a LOW voltage. That is, it is possible to suppress noises of the gate signal $G_n$ generated when the transistor T6 is partially turned on.

Accordingly, the basic circuit according to this embodiment can suppress noises of the gate signal $G_n$ generated when the switching element is changed over in addition to advantageous effects substantially equal to the advantageous effects obtained by the basic circuit of the first embodiment.

Third Embodiment

The basic configuration of the display device according to the third embodiment of the present invention is substantially equal to the configuration of the display device according to the first embodiment. The n-th basic circuit 113-$n$ according to this embodiment has the exactly same circuit configuration as the basic circuit 113 shown in FIG. 4. Further, a change in voltage with time of a pair of AC voltage lines $V_{GL\_AC1}$, $V_{GL\_AC1B}$ is as exactly equal to the change of voltage shown in FIG. 5. On the premise of such a configuration, according to this embodiment, basic clock signals CLK1, CLK2, CLK3, CLK4 make a change different from a change of the basic clock signals shown in FIG. 6.

Figure 9:
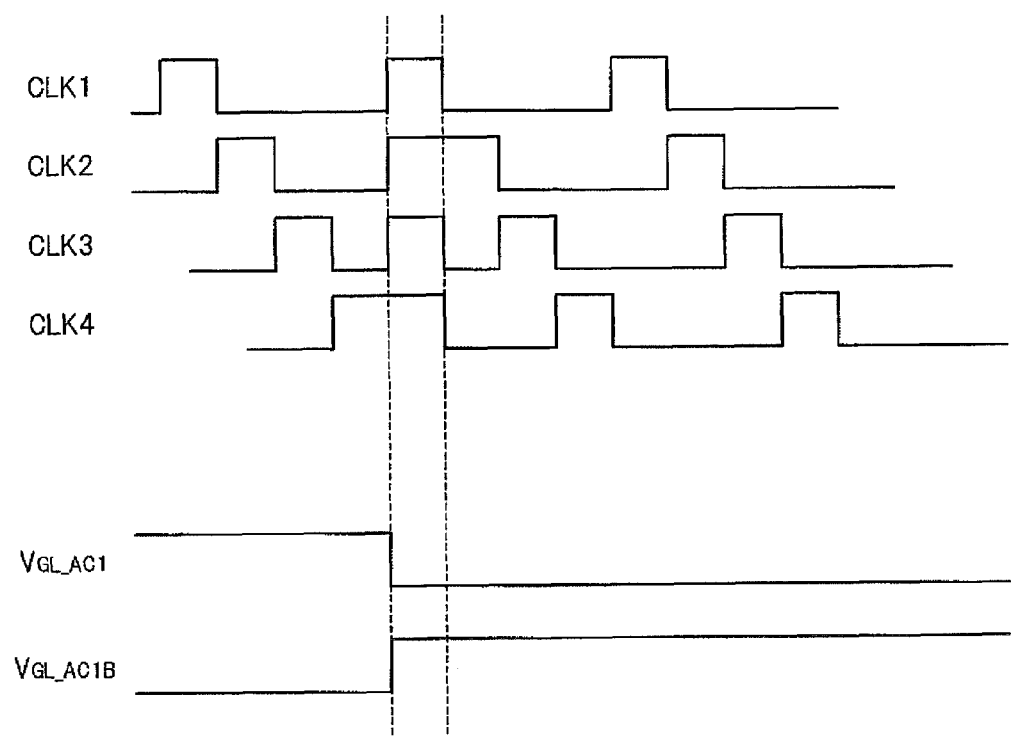
FIG. 9 is a view showing a change in voltage with time of base clock signals according to a third embodiment of the present invention.

FIG. 9 shows a change in voltages with time of the basic clock signals CLK1, CLK2, CLK3, CLK4 according to this embodiment together with a change in voltages of the pair of AC voltage lines $V_{GL\_AC1}$, $V_{GL\_AC1B}$. As shown in FIG. 6, voltages of the respective basic clock signals are sequentially changed as the basic clock signals of four phases which differ from each other in phase. In addition to the above-mentioned change in voltages, voltages of all of the basic clock signals assume a HIGH voltage during a period in response to a change in voltages of the pair of AC voltage lines $V_{GL\_AC1}$, $V_{GL\_AC1B}$.

Here, in case of the basic clock signals shown in FIG. 6, when the switching elements are changed over along with a change of the AC voltage lines, as mentioned previously, due to the distribution of charge from the holding capacitor C3, a voltage of the node N2 is lowered. However, the basic clock signals CLK1, CLK2, CLK3, CLK4 according to this embodiment assume a HIGH voltage during a period immediately after the AC voltage lines are changed. In case of the n-th basic circuit 113-$n$ shown in FIG. 4, n satisfies n=4m−3, and the basic clock signal CLK3 is inputted to the input terminal IN2. The holding capacitor C3 is charged with a HIGH voltage of the basic clock signal CLK3 and hence, lowering of the voltage of the node N2 is suppressed.

Accordingly, for example, as shown in FIG. 9, when the AC voltage line $V_{GL\_AC1}$ is changed from a HIGH voltage to a LOW voltage and the AC voltage line $V_{GL\_AC1}$ is changed from a LOW voltage to a HIGH voltage, the voltage of the node N2B is changed from a LOW voltage to a HIGH voltage. In this embodiment, lowering of the voltage of the node N2 which occurs when the node N2A and the node N2B are switched over is suppressed and hence, the node N2B can change the voltage from a LOW voltage to a HIGH voltage within a shorter time. In this case, since the transistors T2A, T6A are sufficiently changed into an ON state in a shorter time and hence, the drive performances of these transistors are enhanced.

Note that the basic circuit 113 according to the second embodiment shown in FIG. 7, becomes equivalent to the basic circuit 113 according to the first embodiment shown in FIG.

4, in case of that with respect to the two pairs of AC voltage lines $V_{GL\_AC1}, V_{GL\_AC1B}, V_{GL\_AC2}, V_{GL\_AC2B}$ shown in FIG. 8 which are connected to the basic circuit 113 according to the second embodiment shown in FIG. 7, a length of the period P1A when the AC voltage line $V_{GL\_AC1}$ assumes a HIGH voltage, a length of the period P2A when the AC voltage line $V_{GL\_AC1}$ assumes a LOW voltage, a length of the period P1B when the AC voltage line $V_{GL\_AC2}$ assumes a LOW voltage, a length of the period P2B when the AC voltage line $V_{GL\_AC2}$ assumes a HIGH voltage, become equal. In this case the phase of the AC voltage line $V_{GL\_AC1}$ becomes exactly opposite to the phase of the AC voltage line $V_{GL\_AC2}$.

Also note that, in the basic circuit 113 shown in FIG. 7, although the LOW voltage applying switching circuit 11 and the switching signal supply switching circuit 13 are respectively provided with two pieces of transistors arranged parallel to each other, the number of the transistors is not limited to two. The number of the transistors may be three, four or more. In this case, the number of AC voltage lines connected corresponding to the respective nodes is increased such as three pairs or four pairs of AC voltage lines. Time during which a HIGH voltage is applied to the transistors is divided among a larger number of transistors so that time during which a HIGH voltage is applied to one transistor can be further reduced.

The case where periods during which the pair of AC voltage lines $V_{GL\_AC1B}$ $V_{GL\_AC1B}$ assume a HIGH voltage respectively are equal or where periods during which two AC voltage lines $V_{GL\_AC1}$, $V_{GL\_AC2}$ assume a HIGH voltage respectively are equal has been explained heretofore. However, the present invention is not limited to such a case. Provided that the time during which a HIGH voltage is applied is divided among a plurality of transistors arranged parallel to each other so that time during which a HIGH voltage is applied to one transistor is reduced, it is possible to acquire advantageous effects of the present invention even when the divided periods are not equal.

Figure 10:
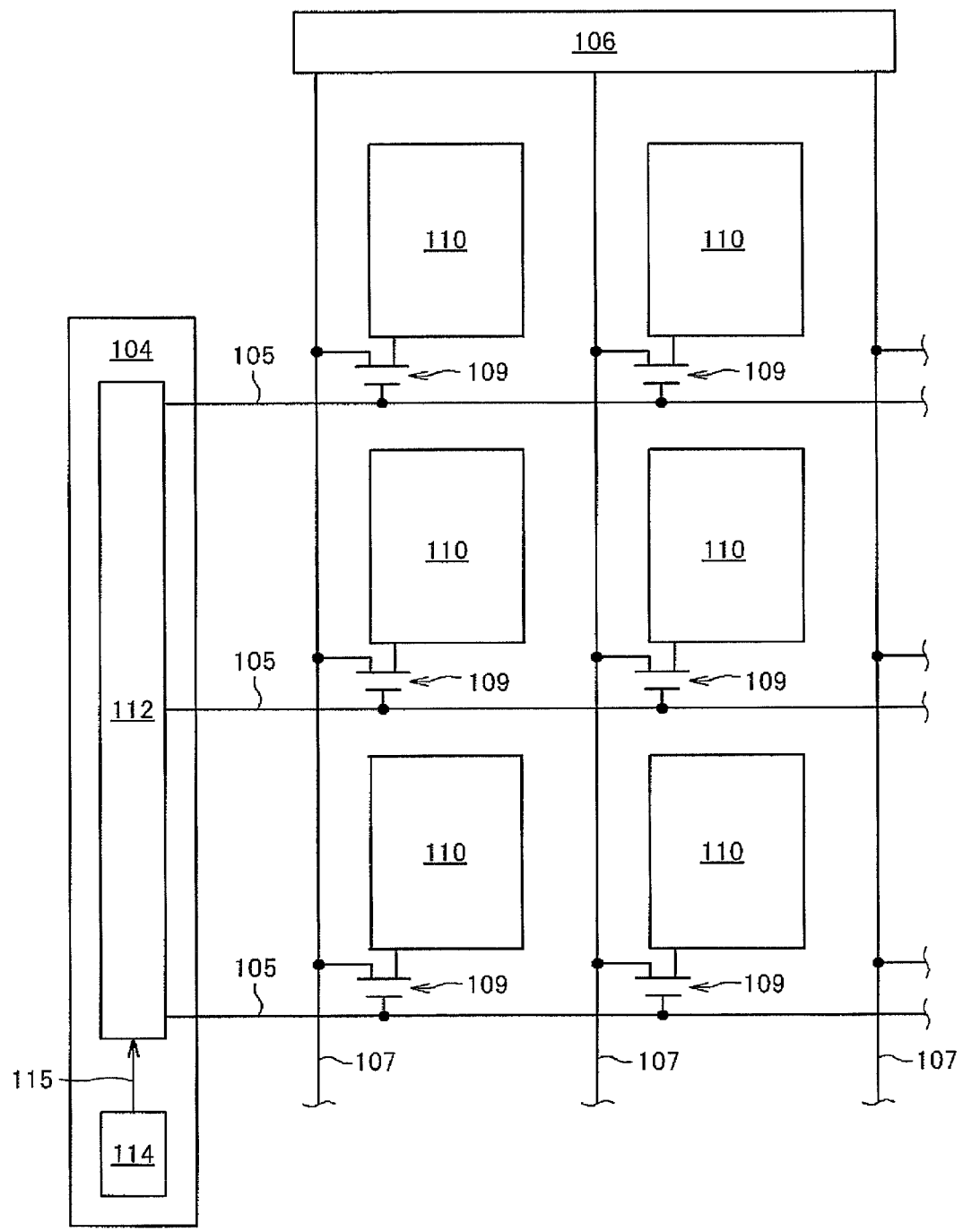
FIG. 10 is a conceptual view of an equivalent circuit of a TFT substrate provided to a liquid crystal display device according to another example of the embodiment of the present invention.
Figure 11:
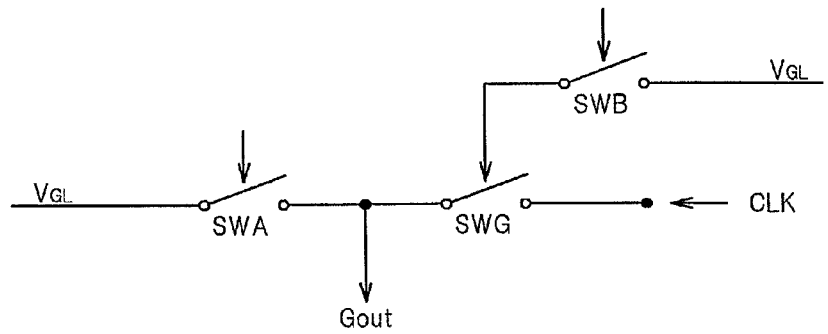
FIG. 11 is a schematic view showing the configuration of a basic circuit of a shift register circuit according to a related art.

Further, with respect to the display device according to the embodiments of the present invention, the explanation has been made with respect to an IPS liquid crystal display device as shown in FIG. 2. However, the display device according to the present invention may be liquid crystal display devices adopting other drive methods such as a VA (Vertically Aligned) liquid crystal display device or a TN (Twisted Nematic) liquid crystal display device. Further, the display device may be other display devices such as an organic EL display device. FIG. 10 is a conceptual view of an equivalent circuit of a TFT substrate 102 provided to a VA or TN liquid crystal display device. In case of the VA or TN liquid crystal display device, common electrodes 111 are mounted on a filter substrate 101 which are opposed to the TFT substrate 102.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a display area including a plurality of pixel electrodes arranged in a matrix;
    a plurality of thin film transistors for supplying a display signal voltage to the respective pixel electrodes;
    a plurality of gate signal lines, each configured for applying a HIGH voltage drive signal to a switch terminal of one of the plurality of thin film transistors during a signal HIGH period, and for applying a LOW voltage drive signal to the switch terminal of the one of the plurality of thin film transistors during a signal LOW period; and
    a gate driving circuit formed at the periphery of the display area, the gate driving circuit including:
        a pair of LOW voltage applying switching elements which are connected in parallel with respect to the gate signal line, and which apply the LOW voltage drive signal to the gate signal line in an ON state respectively; and
        a pair of AC voltage lines, each of the pair of AC voltage lines being directly connected with a source/drain terminal of one of the pair of LOW voltage applying switching elements and each supplying a HIGH voltage and a LOW voltage periodically and alternately to the source/drain terminal of the one of the pair of LOW voltage applying switching elements, wherein:
    one of the pair of LOW voltage applying switching elements is brought into an ON state in response to the signal LOW period and one of the pair of AC voltage lines being connected with the one of the pair of LOW voltage applying switching elements is the LOW voltage; and
    another one of the pair of LOW voltage applying switching elements is brought into an OFF state within the signal LOW period.

2. The display device according to claim 1, wherein the HIGH voltage is applied to the source/drain terminal of said each LOW voltage applying switching element when the LOW voltage applying switching element is in an OFF state.

3. The display device according to claim 1, further comprising:
    a HIGH voltage applying switching element which is connected to the gate signal line, is in an ON state in response to the signal HIGH period and applies the HIGH voltage drive signal to the gate signal line, and is in an OFF state in response to the signal LOW period.

4. The display device according to claim 1, further comprising:
    a HIGH voltage applying switching element which is connected to the gate signal line, is in an ON state in response to the signal HIGH period and applies the HIGH voltage drive signal to the gate signal line, and is in an OFF state in response to the signal LOW period; and
    a pair of switching signal supply switching elements which are connected in parallel with respect to the HIGH voltage applying switching element, and apply the LOW voltage to a switch terminal of the HIGH voltage applying switching element in an ON state respectively.

5. The display device according to claim 1, further comprising:
    a HIGH voltage applying switching element which is connected to the gate signal line, is in an ON state in response to the signal HIGH period and applies the HIGH voltage drive signal to the gate signal line, and is in an OFF state in response to the signal LOW period; and
    a pair of switching signal supply switching elements which are connected in parallel with respect to the HIGH voltage applying switching element, and apply the LOW voltage to a switch terminal of the HIGH voltage applying switching element in an ON state respectively, wherein
    each of the pair of AC voltage lines is further respectively connected with a source/drain terminal of one of the pair of switching signal supply switching elements.

6. The display device according to claim 1, wherein
one of the pair of switching signal supply switching elements is brought into an ON state in response to the signal LOW period and one of the pair of AC voltage lines being connected with the one of the pair of switching signal supply switching elements is in the LOW voltage; and
another one of the pair of switching signal supply switching elements is brought into an OFF state within the signal LOW period.

7. A display device comprising:
a display area including a plurality of pixel electrodes arranged in a matrix;
a plurality of thin film transistors for supplying a display signal voltage to the respective pixel electrodes;
a plurality of gate signal lines configured for applying a HIGH voltage drive signal to a switch terminal of the thin film transistor during a signal HIGH period, and for applying a LOW voltage drive signal to the switch terminal of the thin film transistor during a signal LOW period; and
a gate driving circuit formed at the periphery of the display area, the gate driving circuit including:
  a pair of LOW voltage applying switching elements which are connected in parallel with respect to the gate signal line, and which apply the LOW voltage drive signal to the gate signal line in an ON state respectively;
  a HIGH voltage applying switching element which is connected to the gate signal line, is in an ON state in response to the signal HIGH period and applies the HIGH voltage drive signal to the gate signal line, and is in an OFF state in response to the signal LOW period;
  a pair of switching signal supply switching elements which are connected in parallel with respect to a switch terminal of the HIGH voltage applying switching element, and which apply the LOW voltage to a switch terminal of the HIGH voltage applying switching element in an ON state respectively; and
  a pair of AC voltage lines, each of the pair of AC voltage lines being directly connected with a source/drain terminal of one of the pair of switching signal supply switching elements and each supplying a HIGH voltage and a LOW voltage periodically and alternately to the source/drain terminal of the one of the pair of switching signal supply switching elements, wherein:
one of the pair of switching signal supply switching elements is brought into an ON stage in response to the signal LOW period and one of the pair of AC voltage lines being connected with the one of the pair of switching signal supply switching elements is in the LOW voltage; and
another one of the pair of switching signal supply switching elements is brought into an OFF state within the signal LOW period.

8. The display device according to claim 7, wherein each of the pair of AC voltage lines being directly connected with a source/drain terminal of one of the pair of LOW voltage applying switching elements and each supplying the High voltage and the LOW voltage periodically and alternately to the source/drain terminal of the one of the pair of LOW voltage applying switching elements.

* * * * *